(12) United States Patent
Mera et al.

(10) Patent No.: US 9,627,028 B2
(45) Date of Patent: Apr. 18, 2017

(54) POWER CONVERTER FOR A MEMORY MODULE

(71) Applicant: Enpirion, Inc., Hampton, NJ (US)

(72) Inventors: Narciso Mera, Pittstown, NJ (US); Douglas Dean Lopata, Boyertown, PA (US); Ashraf W. Lotfi, Bridgewater, NJ (US)

(73) Assignee: Enpirion, Inc., Hampton, NJ (US)

( * ) Notice: Subject to any disclaimer, the term of this patent is extended or adjusted under 35 U.S.C. 154(b) by 0 days.

(21) Appl. No.: 14/474,746

(22) Filed: Sep. 2, 2014

(65) Prior Publication Data

US 2014/0369147 A1    Dec. 18, 2014

Related U.S. Application Data

(63) Continuation of application No. 13/088,763, filed on Apr. 18, 2011, now Pat. No. 8,867,295, which is a continuation-in-part of application No. 12/971,166, filed on Dec. 17, 2010, now abandoned.

(51) Int. Cl.
*G11C 5/14* (2006.01)
*G11C 11/4074* (2006.01)

(52) U.S. Cl.
CPC .......... *G11C 11/4074* (2013.01); *G11C 5/147* (2013.01)

(58) Field of Classification Search
CPC ........ G06F 1/26; G06F 1/3203; G06F 1/3275; G06F 1/3225; G06F 1/3296; G06F 3/0625; G11C 11/4074; G11C 29/021; G11C 5/14; G11C 5/147
See application file for complete search history.

(56) References Cited

U.S. PATENT DOCUMENTS

| | | | |
|---|---|---|---|
| 1,889,398 A | 11/1932 | Bishop | |
| 2,600,473 A | 6/1952 | Brockman | |
| 3,210,707 A | 10/1965 | Constantakes | |
| 3,691,497 A | 9/1972 | Bailey et al. | |
| 3,762,039 A | 10/1973 | Douglass et al. | |

(Continued)

FOREIGN PATENT DOCUMENTS

| | | |
|---|---|---|
| GB | 2041818 A | 9/1980 |
| JP | 1072517 A | 3/1989 |

(Continued)

OTHER PUBLICATIONS

Barrado, A., et al., "New DC/DC, Converter with Low Output Voltage, and Fast Transient Response," Proceedings of the IEEE Applied Power Electronics Conference, 2003, pp. 432-437, IEEE, Los Alamitos, CA.

(Continued)

*Primary Examiner* — Son Dinh
*Assistant Examiner* — Uyen B Tran
(74) *Attorney, Agent, or Firm* — Fletcher Yoder, P.C.

(57) ABSTRACT

An apparatus including a memory module and power converter and method of operating the same. In one embodiment, the apparatus includes a memory module, located on a circuit board, configured to operate from a first voltage and a second voltage being a multiple of the first voltage. The apparatus also includes a power converter employing a switched-capacitor power train, located on the circuit board, configured to provide the second voltage for the memory module from the first voltage.

19 Claims, 8 Drawing Sheets

(56) References Cited

U.S. PATENT DOCUMENTS

| | | |
|---|---|---|
| 3,902,148 A | 8/1975 | Drees et al. |
| 3,908,264 A | 9/1975 | Friberg et al. |
| 3,947,699 A | 3/1976 | Whitmer |
| 4,016,461 A | 4/1977 | Roland |
| 4,101,389 A | 7/1978 | Uedaira |
| 4,103,267 A | 7/1978 | Olschewski |
| 4,187,128 A | 2/1980 | Billings et al. |
| 4,199,743 A | 4/1980 | Martincic |
| 4,247,953 A | 1/1981 | Shinagawa et al. |
| 4,433,927 A | 2/1984 | Cavallari |
| 4,586,436 A | 5/1986 | Denney et al. |
| 4,636,752 A | 1/1987 | Saito |
| 4,654,770 A | 3/1987 | Santurtun et al. |
| 4,668,310 A | 5/1987 | Kudo et al. |
| 4,681,718 A | 7/1987 | Oldham |
| 4,689,735 A | 8/1987 | Young |
| 4,751,199 A | 6/1988 | Phy |
| 4,754,317 A | 6/1988 | Comstock et al. |
| 4,761,725 A | 8/1988 | Henze |
| 4,777,465 A | 10/1988 | Meinel |
| 4,801,816 A | 1/1989 | Merlo et al. |
| 4,808,118 A | 2/1989 | Wilson et al. |
| 4,847,986 A | 7/1989 | Meinel |
| 4,870,224 A | 9/1989 | Smith et al. |
| 4,912,622 A | 3/1990 | Steigerwald et al. |
| 4,916,522 A | 4/1990 | Cohn |
| 4,975,671 A | 12/1990 | Dirks |
| 4,982,353 A | 1/1991 | Jacob et al. |
| 5,056,214 A | 10/1991 | Holt |
| 5,059,278 A | 10/1991 | Cohen et al. |
| 5,096,513 A | 3/1992 | Sawa et al. |
| 5,118,298 A | 6/1992 | Murphy |
| 5,161,098 A | 11/1992 | Balakrishnan |
| 5,187,119 A | 2/1993 | Cech et al. |
| 5,245,228 A | 9/1993 | Harter |
| 5,258,662 A | 11/1993 | Skovmand |
| 5,262,296 A | 11/1993 | Ogawa et al. |
| 5,279,988 A | 1/1994 | Saadat et al. |
| 5,285,369 A | 2/1994 | Balakrishnan |
| 5,345,670 A | 9/1994 | Pitzele et al. |
| 5,353,001 A | 10/1994 | Meinel et al. |
| 5,371,415 A | 12/1994 | Dixon et al. |
| 5,414,341 A | 5/1995 | Brown |
| 5,428,245 A | 6/1995 | Lin et al. |
| 5,436,409 A | 7/1995 | Sawada et al. |
| 5,457,624 A | 10/1995 | Hastings |
| 5,469,334 A | 11/1995 | Balakrishnan |
| 5,481,219 A | 1/1996 | Jacobs et al. |
| 5,484,494 A | 1/1996 | Oda et al. |
| 5,510,739 A | 4/1996 | Caravella et al. |
| 5,524,334 A | 6/1996 | Boesel |
| 5,541,541 A | 7/1996 | Salamina et al. |
| 5,548,206 A | 8/1996 | Soo |
| 5,561,438 A | 10/1996 | Nakazawa et al. |
| 5,568,044 A | 10/1996 | Bittner |
| 5,574,273 A | 11/1996 | Nakazawa et al. |
| 5,574,420 A | 11/1996 | Roy et al. |
| 5,578,261 A | 11/1996 | Manzione et al. |
| 5,592,072 A | 1/1997 | Brown |
| 5,594,324 A | 1/1997 | Canter et al. |
| 5,625,312 A | 4/1997 | Kawakami et al. |
| 5,689,213 A | 11/1997 | Sher |
| 5,692,296 A | 12/1997 | Variot |
| 5,783,025 A | 7/1998 | Hwang et al. |
| 5,787,569 A | 8/1998 | Lotfi et al. |
| 5,788,854 A | 8/1998 | Desaigoudar et al. |
| 5,796,276 A | 8/1998 | Phillips et al. |
| 5,802,702 A | 9/1998 | Fleming et al. |
| 5,807,959 A | 9/1998 | Wu et al. |
| 5,834,691 A | 11/1998 | Aoki |
| 5,835,350 A | 11/1998 | Stevens |
| 5,837,155 A | 11/1998 | Inagaki et al. |
| 5,846,441 A | 12/1998 | Roh |
| 5,864,225 A | 1/1999 | Bryson |
| 5,877,611 A | 3/1999 | Brkovic |
| 5,898,991 A | 5/1999 | Fogel et al. |
| 5,912,589 A | 6/1999 | Khoury et al. |
| 5,920,249 A | 7/1999 | Huss |
| 5,973,923 A | 10/1999 | Jitaru |
| 5,977,811 A | 11/1999 | Magazzu |
| 5,998,925 A | 12/1999 | Shimizu |
| 6,005,377 A | 12/1999 | Chen et al. |
| 6,060,176 A | 5/2000 | Semkow et al. |
| 6,081,997 A | 7/2000 | Chia et al. |
| 6,094,123 A | 7/2000 | Roy |
| 6,101,218 A | 8/2000 | Nagano |
| 6,118,351 A | 9/2000 | Kossives et al. |
| 6,118,360 A | 9/2000 | Neff |
| 6,160,721 A | 12/2000 | Kossives et al. |
| 6,169,433 B1 | 1/2001 | Farrenkopf |
| 6,201,429 B1 | 3/2001 | Rosenthal |
| 6,211,706 B1 | 4/2001 | Choi et al. |
| 6,222,403 B1 | 4/2001 | Mitsuda |
| 6,239,509 B1 | 5/2001 | Rader, III et al. |
| 6,255,714 B1 | 7/2001 | Kossives et al. |
| 6,262,564 B1 | 7/2001 | Kanamori |
| 6,285,209 B1 | 9/2001 | Sawai |
| 6,285,539 B1 | 9/2001 | Kashimoto et al. |
| 6,288,920 B1 | 9/2001 | Jacobs et al. |
| 6,317,948 B1 | 11/2001 | Kola et al. |
| 6,320,449 B1 | 11/2001 | Capici et al. |
| 6,353,379 B1 | 3/2002 | Busletta |
| 6,366,486 B1 | 4/2002 | Chen et al. |
| 6,388,468 B1 | 5/2002 | Li |
| 6,407,579 B1 | 6/2002 | Goswick |
| 6,407,594 B1 | 6/2002 | Milazzo et al. |
| 6,440,750 B1 | 8/2002 | Feygenson et al. |
| 6,452,368 B1 | 9/2002 | Basso et al. |
| 6,466,454 B1 | 10/2002 | Jitaru |
| 6,477,065 B2 | 11/2002 | Parks |
| 6,479,981 B2 | 11/2002 | Schweitzer, Jr. et al. |
| 6,495,019 B1 | 12/2002 | Filas et al. |
| 6,541,819 B2 | 4/2003 | Lotfi et al. |
| 6,541,948 B1 | 4/2003 | Wong |
| 6,552,629 B2 | 4/2003 | Dixon et al. |
| 6,570,413 B1 | 5/2003 | Kumagai et al. |
| 6,573,694 B2 | 6/2003 | Pulkin et al. |
| 6,578,253 B1 | 6/2003 | Herbert |
| 6,580,258 B2 | 6/2003 | Wilcox et al. |
| 6,608,332 B2 | 8/2003 | Shimizu et al. |
| 6,621,256 B2 | 9/2003 | Muratov et al. |
| 6,624,498 B2 | 9/2003 | Filas et al. |
| 6,639,427 B2 | 10/2003 | Dray et al. |
| 6,649,422 B2 | 11/2003 | Kossives et al. |
| 6,650,169 B2 | 11/2003 | Faye et al. |
| 6,661,216 B1 | 12/2003 | Grant et al. |
| 6,691,398 B2 | 2/2004 | Gutierrez |
| 6,693,805 B1 | 2/2004 | Steigerwald et al. |
| 6,731,002 B2 | 5/2004 | Choi |
| 6,747,538 B2 | 6/2004 | Kuwata et al. |
| 6,759,836 B1 | 7/2004 | Black, Jr. |
| 6,790,379 B2 | 9/2004 | Aoki et al. |
| 6,791,305 B2 | 9/2004 | Imai et al. |
| 6,806,807 B2 | 10/2004 | Cayne et al. |
| 6,808,807 B2 | 10/2004 | Anand et al. |
| 6,815,936 B2 | 11/2004 | Wiktor et al. |
| 6,822,882 B1 | 11/2004 | Jacobs et al. |
| 6,828,825 B2 | 12/2004 | Johnson et al. |
| 6,856,007 B2 | 2/2005 | Warner |
| 6,879,137 B2 | 4/2005 | Sase et al. |
| 6,912,781 B2 | 7/2005 | Morrison et al. |
| 6,922,041 B2 | 7/2005 | Goder et al. |
| 6,922,044 B2 | 7/2005 | Walters et al. |
| 6,922,130 B2 | 7/2005 | Okamoto |
| 6,984,968 B2 | 1/2006 | Moon |
| 6,989,121 B2 | 1/2006 | Thummel |
| 6,998,952 B2 | 2/2006 | Zhou et al. |
| 7,015,544 B2 | 3/2006 | Lotfi et al. |
| 7,019,505 B2 | 3/2006 | Dwarakanath et al. |
| 7,020,295 B2 | 3/2006 | Hamada et al. |
| 7,021,518 B2 | 4/2006 | Kossives et al. |
| 7,023,315 B2 | 4/2006 | Yeo et al. |
| 7,038,438 B2 | 5/2006 | Dwarakanath et al. |
| 7,038,514 B2 | 5/2006 | Leith et al. |

(56) References Cited

U.S. PATENT DOCUMENTS

| | | |
|---|---|---|
| 7,057,486 B2 | 6/2006 | Kiko |
| 7,061,217 B2 | 6/2006 | Bayer et al. |
| 7,101,737 B2 | 9/2006 | Cobbley |
| 7,102,419 B2 | 9/2006 | Lou et al. |
| 7,109,688 B1 | 9/2006 | Chiu et al. |
| 7,148,670 B2 | 12/2006 | Inn et al. |
| 7,157,888 B2 | 1/2007 | Chen et al. |
| 7,175,718 B2 | 2/2007 | Nobutoki et al. |
| 7,180,395 B2 | 2/2007 | Lotfi et al. |
| 7,190,150 B2 | 3/2007 | Chen et al. |
| 7,214,985 B2 | 5/2007 | Lotfi et al. |
| 7,229,886 B2 | 6/2007 | Lotfi et al. |
| 7,230,302 B2 | 6/2007 | Lotfi et al. |
| 7,230,316 B2 | 6/2007 | Yamazaki et al. |
| 7,232,733 B2 | 6/2007 | Lotfi et al. |
| 7,235,955 B2 | 6/2007 | Solie et al. |
| 7,236,086 B1 | 6/2007 | Vinciarelli et al. |
| 7,244,994 B2 | 7/2007 | Lotfi et al. |
| 7,250,842 B1 | 7/2007 | Johnson et al. |
| 7,256,674 B2 | 8/2007 | Lotfi et al. |
| 7,276,998 B2 | 10/2007 | Lotfi et al. |
| 7,297,631 B2 | 11/2007 | Nair et al. |
| 7,319,311 B2 | 1/2008 | Nishida |
| 7,330,017 B2 | 2/2008 | Dwarakanath et al. |
| 7,348,829 B2 | 3/2008 | Choy et al. |
| 7,352,162 B1 | 4/2008 | Chang et al. |
| 7,368,897 B2 | 5/2008 | Qahouq et al. |
| 7,414,507 B2 | 8/2008 | Giandalia et al. |
| 7,423,508 B2 | 9/2008 | Gardner et al. |
| 7,426,780 B2 | 9/2008 | Lotfi et al. |
| 7,434,306 B2 | 10/2008 | Gardner |
| 7,462,317 B2 | 12/2008 | Lotfi et al. |
| 7,482,795 B2 | 1/2009 | Parto et al. |
| 7,482,796 B2 | 1/2009 | Nishida |
| 7,498,522 B2 | 3/2009 | Itoh |
| 7,501,805 B2 | 3/2009 | Chen et al. |
| 7,521,907 B2 | 4/2009 | Cervera et al. |
| 7,522,432 B2 | 4/2009 | Shimizu |
| 7,544,995 B2 | 6/2009 | Lotfi et al. |
| 7,598,606 B2 | 10/2009 | Chow et al. |
| 7,602,167 B2 | 10/2009 | Trafton et al. |
| 7,610,022 B1 | 10/2009 | Teo et al. |
| 7,612,603 B1 | 11/2009 | Petricek et al. |
| 7,635,910 B2 | 12/2009 | Sinaga et al. |
| 7,642,762 B2 | 1/2010 | Xie et al. |
| 7,676,402 B2 | 3/2010 | Moody |
| 7,679,342 B2 | 3/2010 | Lopata et al. |
| 7,688,172 B2 | 3/2010 | Lotfi et al. |
| 7,710,093 B2 | 5/2010 | Dwarakanath et al. |
| 7,714,558 B2 | 5/2010 | Wu |
| 7,728,573 B2 | 6/2010 | Capilla et al. |
| 7,733,072 B2 | 6/2010 | Kanakubo |
| 7,746,041 B2 | 6/2010 | Xu et al. |
| 7,746,042 B2 | 6/2010 | Williams et al. |
| 7,790,500 B2 | 9/2010 | Ramos et al. |
| 7,791,324 B2 | 9/2010 | Mehas et al. |
| 7,791,440 B2 | 9/2010 | Ramadan et al. |
| 7,838,395 B2 | 11/2010 | Badakere et al. |
| 7,859,233 B1 | 12/2010 | Silva et al. |
| 7,876,080 B2 | 1/2011 | Dwarakanath et al. |
| 7,876,572 B2 | 1/2011 | Sota et al. |
| 7,888,926 B2 | 2/2011 | Ishino |
| 7,893,676 B2 | 2/2011 | Hanna |
| 7,911,294 B2 | 3/2011 | Harada et al. |
| 7,914,808 B2 | 3/2011 | Malaviya et al. |
| 7,936,160 B1 | 5/2011 | Sheehan |
| 7,948,280 B2 | 5/2011 | Dwarakanath et al. |
| 7,948,772 B2 | 5/2011 | Tung et al. |
| 7,974,103 B2 | 7/2011 | Lim et al. |
| 8,013,580 B2 | 9/2011 | Cervera et al. |
| 8,018,315 B2 | 9/2011 | Lotfi et al. |
| 8,030,908 B2 | 10/2011 | Huang |
| 8,085,106 B2 | 12/2011 | Huda et al. |
| 8,109,587 B2 | 2/2012 | Ishizaki |
| 8,154,261 B2 | 4/2012 | Lopata et al. |
| 8,283,901 B2 | 10/2012 | Lopata et al. |
| 8,410,769 B2 | 4/2013 | Lopata et al. |
| 8,520,402 B1 | 8/2013 | Sivasubramaniam |
| 8,686,698 B2 | 4/2014 | Lopata et al. |
| 8,692,532 B2 | 4/2014 | Lopata et al. |
| 8,698,463 B2 | 4/2014 | Dwarakanath et al. |
| 8,867,295 B2 | 10/2014 | Lopata et al. |
| 2001/0030595 A1 | 10/2001 | Hamatani et al. |
| 2001/0033015 A1 | 10/2001 | Corisis |
| 2001/0041384 A1 | 11/2001 | Ohgiyama et al. |
| 2002/0008566 A1* | 1/2002 | Taito et al. .............. 327/536 |
| 2002/0024873 A1 | 2/2002 | Tomishima et al. |
| 2002/0031032 A1 | 3/2002 | Ooishi |
| 2002/0076851 A1* | 6/2002 | Eden et al. .............. 438/106 |
| 2002/0135338 A1 | 9/2002 | Hobrecht et al. |
| 2002/0153258 A1 | 10/2002 | Filas et al. |
| 2002/0175661 A1 | 11/2002 | Wheeler et al. |
| 2003/0062541 A1 | 4/2003 | Warner |
| 2003/0076662 A1 | 4/2003 | Miehling |
| 2003/0189869 A1 | 10/2003 | Yamagata et al. |
| 2003/0232196 A1 | 12/2003 | Anand et al. |
| 2004/0125621 A1 | 7/2004 | Yang et al. |
| 2004/0130428 A1 | 7/2004 | Mignano et al. |
| 2004/0150500 A1 | 8/2004 | Kiko |
| 2004/0169498 A1 | 9/2004 | Goder et al. |
| 2004/0246077 A1 | 12/2004 | Misu et al. |
| 2004/0268161 A1* | 12/2004 | Ross .............. G11C 5/147 713/300 |
| 2005/0011672 A1 | 1/2005 | Alawani et al. |
| 2005/0035747 A1 | 2/2005 | Mullett |
| 2005/0046405 A1 | 3/2005 | Trafton et al. |
| 2005/0088216 A1 | 4/2005 | Arndt et al. |
| 2005/0168203 A1 | 8/2005 | Dwarakanath et al. |
| 2005/0168205 A1 | 8/2005 | Dwarakanath et al. |
| 2005/0169024 A1 | 8/2005 | Dwarakanath et al. |
| 2005/0179472 A1 | 8/2005 | Nakamura et al. |
| 2005/0187756 A1 | 8/2005 | Lotfi et al. |
| 2005/0212132 A1 | 9/2005 | Hsuan et al. |
| 2006/0009023 A1 | 1/2006 | Nair et al. |
| 2006/0038225 A1 | 2/2006 | Lotfi et al. |
| 2006/0096087 A1 | 5/2006 | Lotfi et al. |
| 2006/0096088 A1 | 5/2006 | Lotfi et al. |
| 2006/0097831 A1 | 5/2006 | Lotfi et al. |
| 2006/0097832 A1 | 5/2006 | Lotfi et al. |
| 2006/0097833 A1 | 5/2006 | Lotfi et al. |
| 2006/0109072 A1 | 5/2006 | Giandalia et al. |
| 2006/0132217 A1 | 6/2006 | Lou et al. |
| 2006/0145800 A1 | 7/2006 | Dadafshar et al. |
| 2006/0197207 A1 | 9/2006 | Chow et al. |
| 2006/0239046 A1 | 10/2006 | Zane et al. |
| 2006/0294437 A1* | 12/2006 | Washburn et al. .............. 714/42 |
| 2007/0023892 A1 | 2/2007 | Gauche et al. |
| 2007/0025092 A1 | 2/2007 | Lee et al. |
| 2007/0074386 A1 | 4/2007 | Lotfi et al. |
| 2007/0075815 A1 | 4/2007 | Lotfi et al. |
| 2007/0075816 A1 | 4/2007 | Lotfi et al. |
| 2007/0075817 A1 | 4/2007 | Lotfi et al. |
| 2007/0109700 A1 | 5/2007 | Shimogawa et al. |
| 2007/0164721 A1 | 7/2007 | Han |
| 2007/0210777 A1 | 9/2007 | Cervera et al. |
| 2007/0246808 A1 | 10/2007 | Ewe et al. |
| 2007/0296383 A1* | 12/2007 | Xu et al. .............. 323/282 |
| 2008/0010075 A1 | 1/2008 | Moody |
| 2008/0018366 A1 | 1/2008 | Hanna |
| 2008/0055944 A1 | 3/2008 | Wang et al. |
| 2008/0079405 A1 | 4/2008 | Shimizu |
| 2008/0090079 A1 | 4/2008 | Fajardo et al. |
| 2008/0094114 A1 | 4/2008 | Dwarakanath et al. |
| 2008/0106246 A1 | 5/2008 | Dwarakanath et al. |
| 2008/0180075 A1 | 7/2008 | Xie et al. |
| 2008/0258274 A1 | 10/2008 | Sinaga et al. |
| 2008/0258278 A1 | 10/2008 | Ramos et al. |
| 2008/0301929 A1 | 12/2008 | Lotfi et al. |
| 2009/0004774 A1 | 1/2009 | Lee et al. |
| 2009/0057822 A1 | 3/2009 | Wen et al. |
| 2009/0065964 A1 | 3/2009 | Lotfi et al. |
| 2009/0066300 A1 | 3/2009 | Lotfi et al. |
| 2009/0066467 A1 | 3/2009 | Lotfi et al. |
| 2009/0066468 A1 | 3/2009 | Lotfi et al. |

(56) References Cited

U.S. PATENT DOCUMENTS

| | | |
|---|---|---|
| 2009/0068347 A1 | 3/2009 | Lotfi et al. |
| 2009/0068400 A1 | 3/2009 | Lotfi et al. |
| 2009/0068761 A1 | 3/2009 | Lotfi et al. |
| 2009/0146297 A1 | 6/2009 | Badakere et al. |
| 2009/0167267 A1 | 7/2009 | Dwarakanath et al. |
| 2009/0212751 A1 | 8/2009 | Cervera et al. |
| 2009/0224823 A1 | 9/2009 | Gyohten et al. |
| 2009/0261791 A1 | 10/2009 | Lopata et al. |
| 2009/0295503 A1 | 12/2009 | Harada et al. |
| 2009/0296310 A1 | 12/2009 | Chikara |
| 2010/0072816 A1 | 3/2010 | Kenkare et al. |
| 2010/0084750 A1 | 4/2010 | Lotfi et al. |
| 2010/0087036 A1 | 4/2010 | Lotfi et al. |
| 2010/0110794 A1 | 5/2010 | Kim et al. |
| 2010/0111179 A1 | 5/2010 | Chujoh et al. |
| 2010/0164449 A1 | 7/2010 | Dwarakanath et al. |
| 2010/0164650 A1 | 7/2010 | Abou-Alfotouh et al. |
| 2010/0212150 A1 | 8/2010 | Lotfi et al. |
| 2010/0214746 A1 | 8/2010 | Lotfi et al. |
| 2010/0301496 A1 | 12/2010 | Koduri |
| 2011/0031947 A1 | 2/2011 | You |
| 2011/0095742 A1 | 4/2011 | Lopata et al. |
| 2011/0101933 A1 | 5/2011 | Lopata et al. |
| 2011/0101934 A1 | 5/2011 | Lopata et al. |
| 2011/0101948 A1 | 5/2011 | Lopata et al. |
| 2011/0101949 A1 | 5/2011 | Lopata et al. |
| 2011/0181383 A1 | 7/2011 | Lotfi et al. |
| 2011/0316501 A1 | 12/2011 | Cervera et al. |
| 2012/0153912 A1 | 6/2012 | Demski et al. |
| 2012/0154013 A1 | 6/2012 | Mera et al. |
| 2012/0176105 A1 | 7/2012 | Chang et al. |
| 2013/0293203 A1 | 11/2013 | Chen et al. |
| 2013/0320951 A1 | 12/2013 | Wu et al. |

FOREIGN PATENT DOCUMENTS

| | | |
|---|---|---|
| JP | 2-228013 A | 9/1990 |
| JP | 5-314885 | 11/1993 |
| JP | 6-251958 A | 9/1994 |

OTHER PUBLICATIONS

Betancourt-Zamora, R.J. et al., "A 1.5 mW, 200 MHz CMOS VCO for Wireless Biotelemetry," First International Workshop on Design of Mixed-Mode Integrated Circuits and Applications, Jul. 1997, pp. 72-74, Cancun, Mexico.

Goder, D., et al., "V2 Architecture Provides Ultra-Fast Transient Response in Switch Mode Power Supplies," Proceedings of HFPC Power Conversion, 1996, pp. 414-420.

Goodman, J. et al., "An Energy/Security Scalable Encryption Processor Using an Embedded Variable Voltage DC/DC Converter," IEEE Journal of Solid-State Circuits, Nov. 1998, vol. 33, No. 11, IEEE, Los Alamitos, CA.

Horowitz, P., et al., "The Art of Electronics," Second Edition, 1989, pp. 288-291, Cambridge University Press, Cambridge, MA.

"Linear Technology: LTC3736-1: Dual 2-Phase, No RSENSETM, Synchronous Controller with Spread Spectrum," 2004, 28 pp., Linear Technology Corporation, Milpitas, CA.

Lotfi, A.W., et al., "Issues and Advances in High-Frequency Magnetics for Switching Power Suppiles," Proceedings of the IEEE, Jun. 2001, vol. 89, No. 6, pp. 833-845, IEEE, Los Alamitos, CA.

Patella, B.J., et al., "High-Frequency Digital Controller IC for DC/DC Converters," IEEE Proceedings of the Applied Power Electronics Conference, Mar. 10, 2002, 7 pp., IEEE, Los Alamitos, CA.

Peterchev, A.V., et al., "Quantization Resolution and Limit Cycling in Digitally Controlled PWM Converters," IEEE Transactions on Power Electronics, Jan. 2003, pp. 301-303, vol. 18, No. 1, IEEE, Los Alamitos, CA.

Redl, R., et al., "Optimizing the Load Transient Response of the Buck Converter," Proceedings of the IEEE Applied Power Electronics Conference, 1998, pp. 170-176, IEEE, Los Alamitos, CA.

Schoneman, G.K., et al., "Output Impedance Considerations for Switching Regulators with Current Injected Control," Proceedings of the 18th Annual IEEE Power Electronics Specialists Conference, Jun. 1987, pp. 324-335, IEEE, Los Alamitos, CA.

Soto, A., et al. "Analysis of the Buck Converter for Scaling the Supply Voltage of Digital Circuits," Proceedings of the IEEE Applied Power Electronics Conference, 2003, pp. 711-717, IEEE, Los Alamitos, CA.

Soto, A., et al., "Design Methodology for Dynamic Voltage Scaling in the Buck Converter," Proceedings of the IEEE Applied Power Electronics Conference, 2005, pp. 263-269, IEEE, Los Alamitos, CA.

"TPS40100: Midrange Input Synchronous Buck Controller with Advanced Sequencing and Output Margining," May 2005, 37 pp., Texas Instruments Incorporated, Dallas, TX.

Zhou, X., et al., "Improved Light-Load Efficiency for Synchronous Rectifier Voltage Regulation Module," IEEE Transcations on Power Electronics, Sep. 2000, pp. 826-834, vol. 15, No. 5, IEEE, Los Alamitos, CA.

Feng, P., et al., "Chapter 1: History of the High-Voltage Charge Pump," Charge Pump Circuit Design, McGraw-Hill Electronic Engineering, Jun. 27, 2006, pp. 1-10.

Han, J., "A New Approach to Reducing Output Ripple in Switched-Capacitor-Based Step-Down DC-DC Converters," IEEE Transactions on Power Electronics, vol. 21, No. 6, Nov. 2006, pp. 1548-1555.

"Holtek: HT7660: CMOS Switched-Capacitor Voltage Converter," Nov. 30, 1999, Holtek Semiconductor, Inc., Hsinchu, Taiwan, R.O.C., 9 pages.

"Linear Technology: LT1054: Switched-Capacitor Voltage Converter with Regulator," 1987, Linear Technology Corporation, Milpitas, CA, 16 pages.

"Linear Technology: LTC1144: Switched-Capacitor Wide Input Range Voltage Converter with Shutdown," 1994, Linear Technology Corporation, Milpitas, CA, 8 pages.

Ma, M., "Design of High Efficiency Step-Down Switched Capacitor DC-DC Converter," Thesis submitted to Oregon State University, May 21, 2003, pp. 1-65.

"Maxim: MAX828/MAX829 Switched-Capacitor Voltage Inverters," 19-0495; Rev 3; 9/99, Maxim Integrated Products, Sunnyvale, CA, 8 pages.

"National Semiconductor: LM2685: Switched Capacitor Voltage Converter," Sep. 2005, National Semiconductor, Santa Clara, CA, 9 pages.

Chhawchharia, P., et al., "On the Reduction of Component Count in Switched Capacitor DC/DC Convertors," IEEE, Jun. 1997, pp. 1395-1401.

"Automotive Grade AUIRS2016S (TR) High Side Driver with Internal Vs Recharge," International Rectifier, Datasheet, Jan. 26, 2009, 23 pages.

Ludikhuize, A.W., "A Review of RESURF Technology," Proceedings of IEEE ISPSD 2000, May 22, 2000, pp. 11-18.

CRECAFT and GERGELY, Analog Electronics, Butterworth-Heinemann, First Published 2002, p. 242.

* cited by examiner

POWER CONVERTER FOR A MEMORY MODULE

This application is a continuation of U.S. patent application Ser. No. 13/088,763, entitled "Power Converter for a Memory Module," to Mera, et al, filed on Apr. 18, 2011 currently allowed, which is a continuation-in-part of U.S. patent application Ser. No. 12/971,166, entitled "Controller for a Power Converter and Method of Operating the Same," to Demski, et al., filed on Dec. 17, 2010, which is incorporated herein by reference.

TECHNICAL FIELD

The present invention is directed, in general, to power electronics and, more specifically, to a power converter for a memory module and method of operating the same.

BACKGROUND

A switch-mode power converter (also referred to as a "power converter" or "regulator") is a power supply or power processing circuit that converts an input voltage waveform into a specified output voltage waveform. DC-DC power converters convert a dc input voltage into a dc output voltage. Controllers associated with the power converters manage an operation thereof by controlling the conduction periods of power switches employed therein. Controllers generally control a power switch of the power converter to enable its power conversion function. Controllers may be coupled between an input and output of the power converter in a feedback loop configuration (also referred to as a "control loop" or "closed control loop") to regulate an output characteristic (e.g., an output voltage, an output current, or a combination of an output voltage and an output current) of the power converter.

In an exemplary application, the power converter has the capability to convert an input voltage (e.g., 2.5 volts) supplied by an input voltage source to a lower, output voltage (e.g., 1.25 volts) to power a load. To provide the voltage conversion functions, the power converter includes active power switches such as metal-oxide semiconductor field-effect transistors ("MOSFETs") that are coupled to the input voltage source and periodically switch the active power switches at a switching frequency "$f_s$" that may be on the order of one megahertz ("MHz") or greater.

In typical applications of dc-dc power converters, power conversion efficiency is an important parameter that directly affects the physical size of the end product, its cost and market acceptance. The active power switches that are either fully on with low forward voltage drop or fully off with minimal leakage current provide a recognized advantage for power conversion efficiency in comparison with previous designs that utilized a dissipative "pass" transistor to regulate an output characteristic or a passive diode to provide a rectification function. Previous designs using pass transistors and passive diodes produced operating power conversion efficiencies of roughly 40-70% in many applications. The use of active power switches in many recent power converter designs, particularly as synchronous rectifiers for low output voltages, has increased operating efficiency at full rated load to 90% or more.

Functional electronic plug-in modules such as single- and dual-in-line memory modules ("SIMMs" and"DIMMs") are commonly used to combine a number of chips, such as digital random-access memory ("DRAM"), to form a functional unit such as a memory module in common electronic applications. The standardized physical dimension (height, length and width) and the limited power handling capability of a memory module such as a DIMM card has thus far prohibited the placement of any power handling or conditioning supply on the DIMM card. Therefore, the memory modules such as DIMM cards reside on a motherboard, each with a DIMM card-to-motherboard connector therebetween. This design has several drawbacks including power losses associated with the connector due to high currents conducted through the connector at low voltages. Another drawback is the additional cost resulting from the need to pre-populate the motherboard with a power converter with a sufficient power rating to provide power for the maximum amount of memory that may be installed in an electronic system (e.g., computer) employing the same. The result is the inefficient deployment and utilization of power conversion resources, which has presented a long-standing and unaddressed industry need.

Thus, the problem of providing power for a plug-in module such as a DIMM card with efficient utilization of material and energy resources still remains an unresolved issue. Accordingly, what is needed in the art is a power converter and related method to provide a substantially regulated voltage for a module such as a DIMM card that overcomes deficiencies in the prior art.

SUMMARY OF THE INVENTION

These and other problems are generally solved or circumvented, and technical advantages are generally achieved, by advantageous embodiments of the present invention, including an apparatus including a memory module and power converter, and method of operating the same. In one embodiment, the apparatus (e.g., a DIMM) includes a memory module (e.g., a DRAM module), located on a circuit board, configured to operate from a first voltage and a second voltage being a multiple of the first voltage. The apparatus also includes a power converter employing a switched-capacitor power train, located on the circuit board, configured to provide the second voltage for the memory module from the first voltage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated, and may not be redescribed in the interest of brevity after the first instance. The FIGUREs are drawn to illustrate clearly the relevant aspects of exemplary embodiments.

DETAILED DESCRIPTION OF ILLUSTRATIVE EMBODIMENTS

Figure 1A:
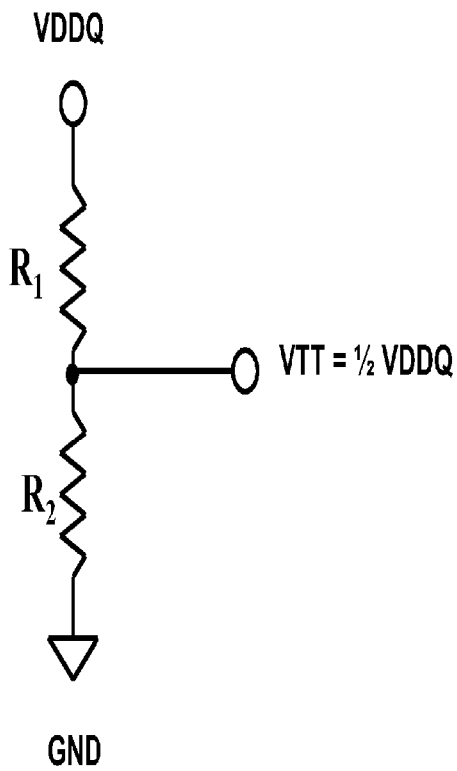
FIGS. 1A and 1B illustrate schematic diagrams of embodiments of circuits to produce a voltage for a DIMM of a multiple of a voltage of a voltage source.

The making and using of the presently exemplary embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely, a power converter including a switched-capacitor power train configured to produce a bias voltage for a plug-in module such as a DIMM card that is a fractional or integer multiple of an input voltage thereto and methods of operating or forming the same. While the principles of the present invention will be described in the environment of a power converter, any application that may benefit from power conversion, such as a power amplifier, including a power converter including a switched-capacitor power train configured to provide an output voltage that is a fractional or integer multiple of an input voltage thereto is well within the broad scope of the present invention.

As described previously hereinabove, the standardized physical dimensions (height, length and width) and the limited power handling capability of a DIMM card has prohibited the placement of a power handling or conditioning supply on the DIMM card. As a result, power converters for modules such as DIMM cards reside on a motherboard, each with a DIMM card-to-motherboard connector therebetween that conducts high levels of current. Although the focus of the description hereinbelow will be on DIMMs, other circuit configurations such as SIMMs and other functional modules are well within the broad scope of the present invention.

Inefficiencies in the use of power conversion resources can be greatly reduced if the installed power handling capability for a functional module such as a DIMM is scaled to suit each individual module and placed thereabout or on each card. In this way, each time a new module (e.g., in the form of a card) is added to the system the cost of power processing is only increased incrementally based on the number of modules actually installed, and not on anticipation of fully populating all the module sockets. Locating power conversion resources, for example, on DIMM cards, means that power may be passed through the DIMM card-to-motherboard connector at higher voltages. The result of locating power conversion resources on the DIMMs reduces the current draw through the connector as well as reduces power loss associated with connector and trace resistances. The number of contact pins in the connector may also be reduced. Therefore, it is advantageous to place a physically and thermally compatible power-handling device on the DIMM to answer this long-standing market need.

A module such as a DIMM card formed with DRAM modules employs a primary power bus with a primary power bus voltage VDDQ at a nominal voltage such as 3.3 volts ("V") and a second power bus with a second power bus voltage VTT at a multiple (e.g., one-half or thereabout) of and continuously tracks the primary power bus voltage VDDQ (e.g., VTT=VDDQ/2). The second power bus is used as a source for address and data bus matching in the DRAM modules. The second power bus should be properly terminated with a line-matching resistance, which is necessary to substantially prevent reflections that can corrupt data transfers on data and address lines of the DRAM modules. Creating the second power bus voltage using a traditional resistor-divider network or a three-terminal regulator results in a high level of power dissipation, which may be a problematic design issue in modern high-density memory systems.

Figure 1B:
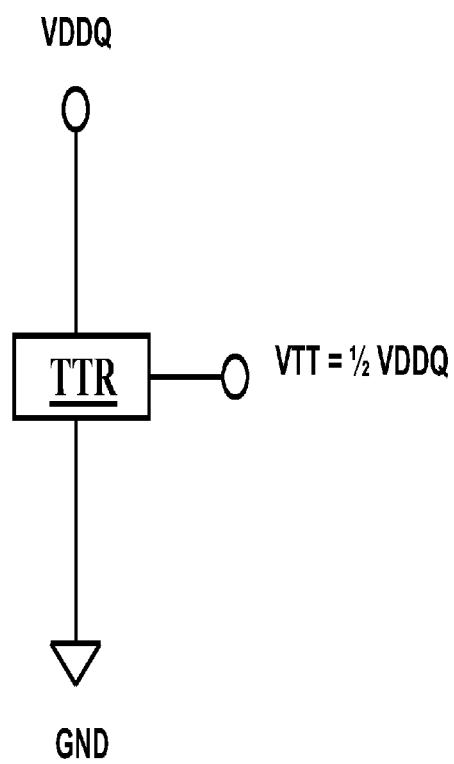

Turning now to FIGS. 1A and 1B, illustrated are schematic diagrams of embodiments of circuits to produce a voltage for a DIMM of a multiple (e.g., about one-half) of a voltage of a voltage source. Beginning with FIG. 1A, the circuit includes a resistor-divider network (a voltage divider) formed with first and second series-coupled resistors $R_1$, $R_2$ between a primary power bus with a primary power bus voltage VDDQ and a local circuit ground GND. The first and second resistors $R_1$, $R_2$ are of substantially equal resistance to produce a second power bus with a second power bus voltage VTT that is equal to about one-half the primary power bus voltage VDDQ.

To reduce a level of power dissipated by the voltage divider, high values of resistance are typically employed. However, practical considerations such as load currents applied to the voltage divider by a controller limit a maximum value of resistance that may be used therein. This problem is particularly acute in low-power power converters that have a very small budget for internal power dissipation. As is generally understood in the art, a voltage divider that produces an output voltage that is equal to one-half an input voltage as a limiting power conversion efficiency of 50 percent ("%") is generally unacceptable from a thermal perspective for mounting the voltage divider on a module such as a DIMM.

Turning now to FIG. 1B, illustrated is a circuit arrangement that employs a three-terminal regulator TTR to produce the second power bus voltage VTT. A three-terminal regulator TTR also exhibits a limiting power conversion efficiency of 50%, which also generally prevents its use on a DIMM.

As introduced herein, a power converter mounted on (or proximate) a plug-in module such as a DIMM card is constructed with a switched-capacitor power train that meets the physical constraints defined by DIMM-card standards. The switched-capacitor power train replaces a conventional voltage source such as a dissipative resistor-divider network, a linear voltage regulator, or a switched-mode power converter.

Figure 2:
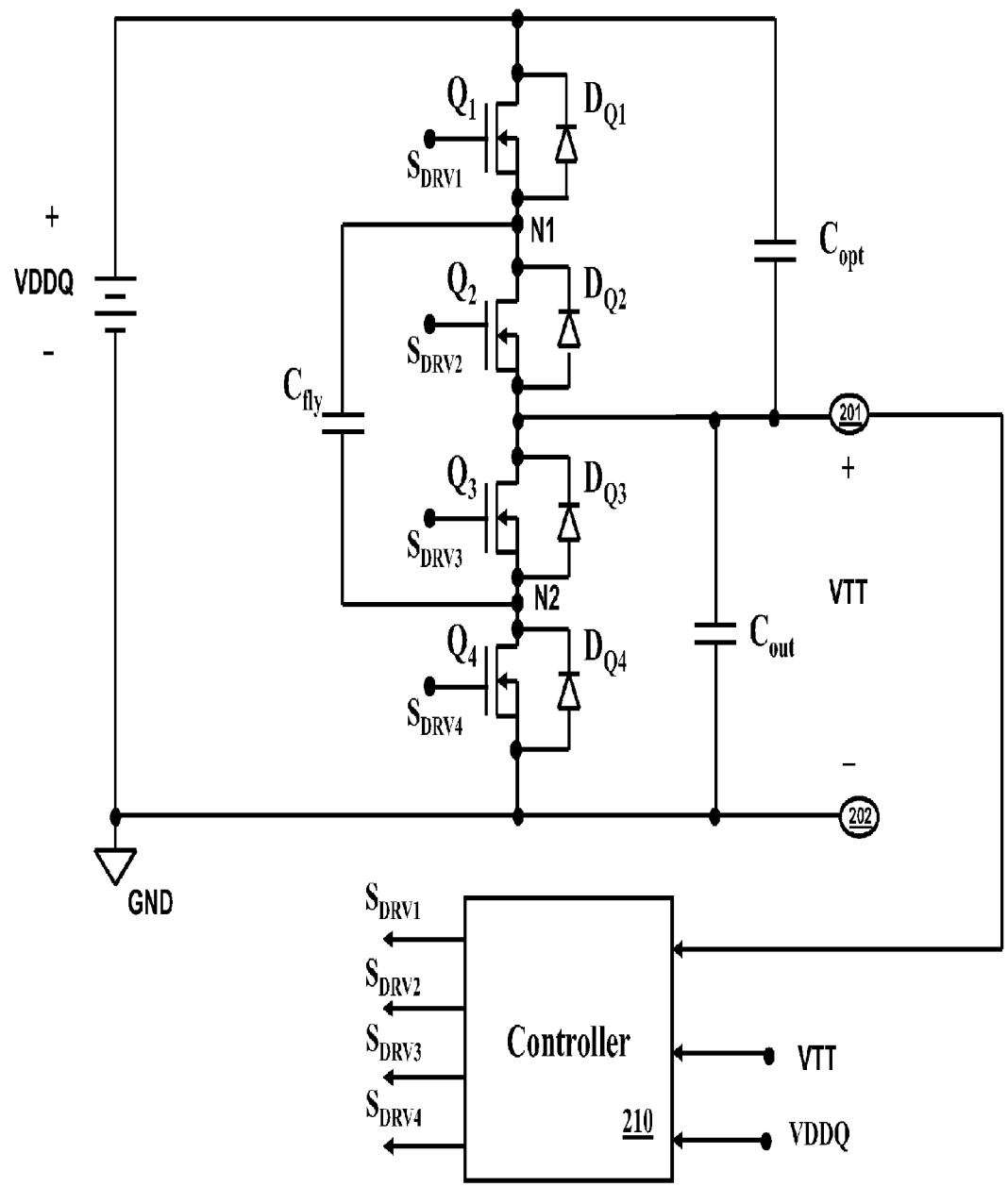
FIGS. 2 to 4 illustrate schematic diagrams of embodiments of power converters (or portions thereof) constructed according to the principles of the present invention.
Figure 3:
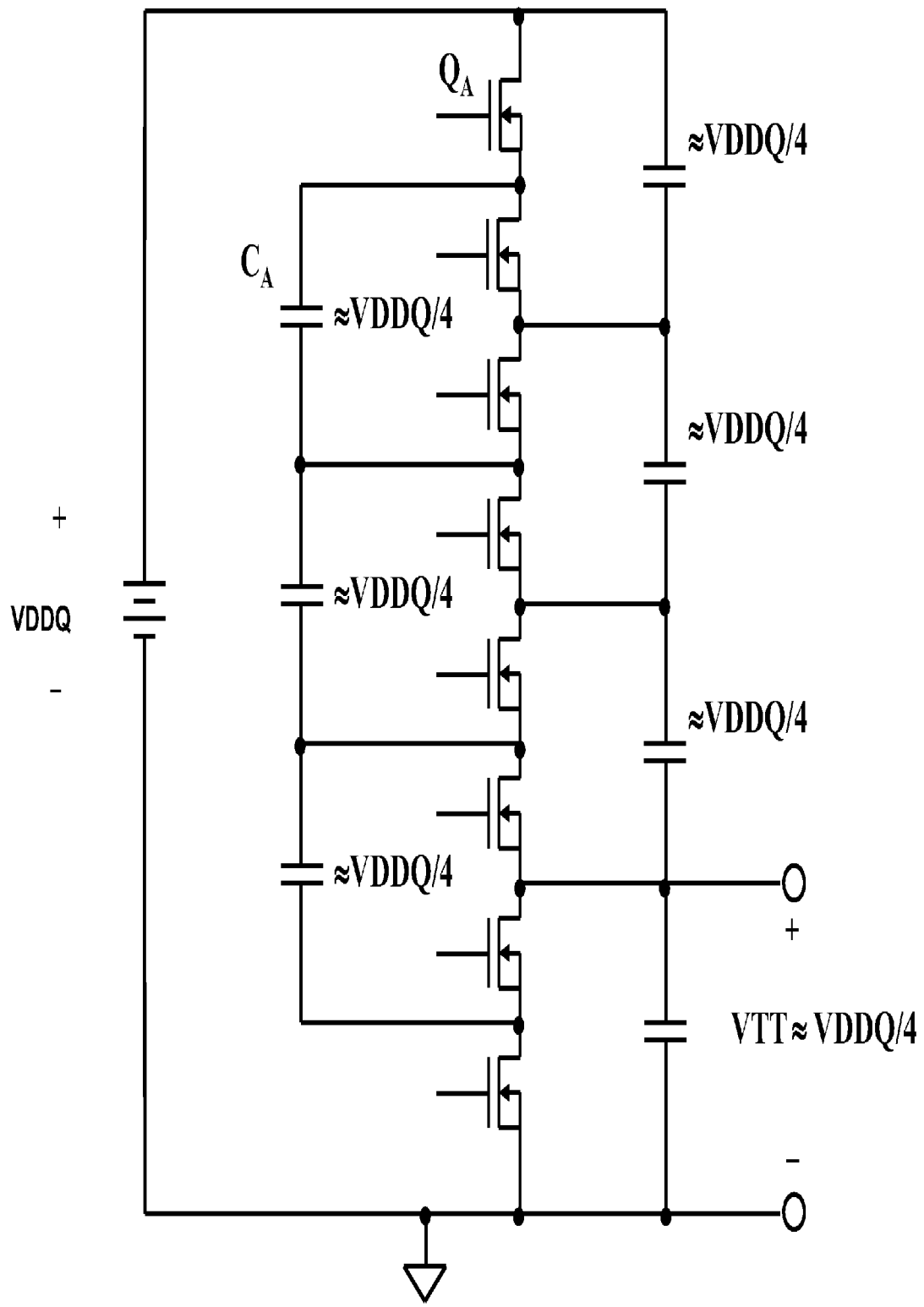
Figure 4:
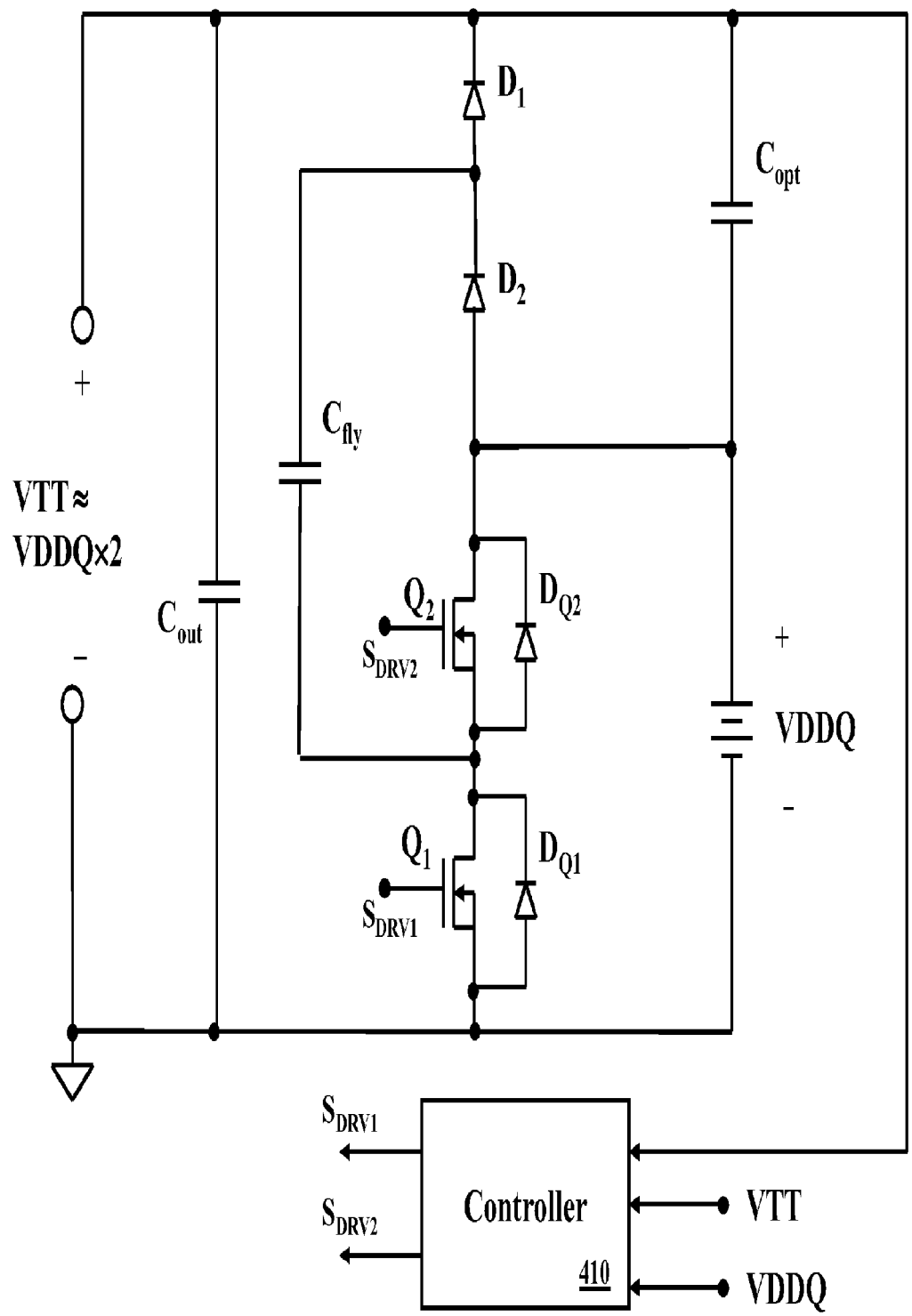

Turning now to FIGS. 2 to 4, illustrated are schematic diagrams of embodiments of power converters (or portions thereof) constructed according to the principles of the present invention. The power converter of FIG. 2 is a switched-capacitor power converter (e.g., a switched-capacitor dc-dc power converter) configured to convert a primary power bus voltage (also referred to as an input voltage with respect to the power converter or a first voltage) VDDQ from a dc input voltage source, represented by a battery, employing a multiple (e.g., one-half) to produce a second power bus voltage (also referred to as an output voltage with respect to the power converter or second voltage) VTT. The power converter employs first, second, third and fourth power switches $Q_1$, $Q_2$, $Q_3$, $Q_4$, a flying capacitor $C_{fly}$, an output capacitor $C_{out}$ and a controller 210. The first, second, third and fourth $D_{Q1}$, $D_{Q2}$, $D_{Q3}$, $D_{Q4}$ represent body diodes of the first, second, third and fourth power switches $Q_1$, $Q_2$, $Q_3$, $Q_4$, respectively. The power converter illustrated in FIG. 2 and variations thereof, for example, as described by Xu, et al., in U.S. Patent Application Publication No. 2007/0296383, entitled "Non-Isolated Bus Converters with Voltage Divider Topology," published Dec. 27, 2007, which is incorporated herein by reference, can be configured to provide high power conversion density and efficiency for an output voltage that is about one-half the input voltage.

The first power switch $Q_1$ has a drain coupled to the input voltage source and a source coupled to a first node N1. The second power switch $Q_2$ has a drain coupled to the first node N1 and a source coupled to an output node 201 to produce the output voltage VTT. The third power switch $Q_3$ has a drain coupled to the output node 201 and a source coupled to a second node N2. The fourth power switch $Q_4$ has a drain coupled to the second node N2 and a source coupled to local circuit ground (an output node 202). A flying capacitor $C_{fly}$ is coupled between the first and second nodes N1, N2. The output voltage VTT is provided at the output nodes 201, 202.

During a first interval of a switching cycle, the first power switch $Q_1$, (e.g., an n-channel metal oxide semiconductor field effect transistor ("MOSFET")), is enabled to conduct by a controller 210 employing a gate-drive signal $S_{DRV1}$, and conductivity of the second power switch $Q_2$ is disabled by the controller 210 employing a gate-drive signal $S_{DRV2}$. During the first interval of a switching cycle, the third power switch $Q_3$, (e.g., also an n-channel metal oxide semiconductor field effect transistor ("MOSFET")), is enabled to conduct by the controller 210 employing a gate-drive signal $S_{DRV3}$, and conductivity of the fourth power switch $Q_4$ is disabled by the controller 210 employing a gate-drive signal $S_{DRV4}$. This switching action at switching frequency $f_s$ causes the top terminal of the flying capacitor $C_{fly}$ to be coupled to the input voltage source, and the bottom terminal of the flying capacitor $C_{fly}$ to be coupled through the third power switch $Q_3$ to the top terminal of the output capacitor $C_{out}$. This causes the flying capacitor $C_{fly}$ and the output capacitor $C_{out}$ each to be charged in series to about one-half the input voltage VDDQ. The voltages produced across the flying and output capacitors $C_{out}$, $C_{fly}$ will generally be almost, but not precisely equal.

During a complementary interval of the switching cycle, the second power switch $Q_2$ is enabled to conduct by the controller 210 employing a gate-drive signal $S_{DRV2}$, and the first power switch $Q_1$ is transitioned to a nonconducting state by the controller 210 employing a gate-drive signal $S_{DRV1}$. Additionally, the fourth power switch $Q_4$ is enabled to conduct by the controller 210 employing a gate-drive signal $S_{DRV4}$, and the third power switch $Q_3$ is transitioned to a nonconducting state by the controller 210 employing a gate-drive signal $S_{DRV3}$. Those skilled in the art should understand, however, that the conduction periods for the first and second power switches $Q_1$, $Q_2$, and the third and fourth power switches $Q_3$, $Q_4$ may be separated by a small time interval to avoid cross conduction therebetween and beneficially to reduce the switching losses associated with the power converter. This switching action causes the top terminal of flying capacitor $C_{fly}$ to be coupled to the output capacitor $C_{out}$, and the bottom terminal of the flying capacitor $C_{fly}$ to be coupled through the fourth power switch $Q_4$ to the bottom terminal of the output capacitor $C_{out}$. This causes the flying capacitor $C_{fly}$ and the output capacitor $C_{out}$ to substantially equalize their voltages, again, at very nearly one-half the input voltage VDDQ. The flying capacitor $C_{fly}$ typically discharges a small portion of its charge into the output capacitor $C_{out}$, which will be partially discharged by a load (not shown) coupled to the output terminals 201, 202.

The third and fourth power switches $Q_3$, $Q_4$, can be replaced with diodes D1, D2 with a loss in power conversion efficiency and with reduced accuracy with which the input voltage VDDQ is multiplied by a factor of one-half (or divided by a factor of two) to produce the output voltage VTT. In a preferred embodiment, active switches such as MOSFETs are employed for the power switches so that the accuracy with which the input voltage VDDQ is multiplied by the factor of one-half is preserved, and high power conversion efficiency is obtained. An optional capacitor $C_{opt}$ may be included in the power converter to provide a higher level of overall performance such as reduced output ripple voltage.

Portions of the power converter illustrated in FIG. 2 can be replicated to provide a higher voltage-multiplying factor, such as a voltage-multiplying factor of one-third, one-fourth or otherwise. Replication of portions of a switched-capacitor dc-dc power converter to provide a higher voltage-multiplying factor (or dividing factor depending on the perspective) are described by P. Chhawchharia, et al., in the paper entitled "On the Reduction of Component Count in Switched Capacitor DC/DC Converters," PESC Record, Vol. 2, June 1997, pp. 1395-1401, which is incorporated herein by reference.

An exemplary power converter topology to provide a voltage-multiplying factor of one-fourth is illustrated in FIG. 3. The power converter (or portions thereof) illustrated in FIG. 3 is formed with eight NMOS MOSFETs, such as the NMOS MOSFET $Q_4$, and seven capacitors, such as the capacitor $C_A$, all preferably substantially equal in capacitance. The power converter illustrated in FIG. 3 is similar to that of the power converter illustrated in FIG. 2, and will not be described further herein in the interest of brevity.

The controller 210 illustrated in FIG. 2 may be formed with a driver (e.g., a gate driver) to provide the gate-drive signals $S_{DRV1}$, $S_{DRV2}$, $S_{DRV3}$, $S_{DRV4}$ to control the respective conductivities of the first, second, third and fourth power switches $Q_1$, $Q_2$, $Q_3$, $Q_4$. There are a number of viable alternatives to implement a driver that include techniques to provide sufficient signal delays to prevent crosscurrents when controlling multiple power switches in the power converter. The driver typically includes switching circuitry incorporating a plurality of driver switches that cooperate to provide the drive signals $S_{DRV1}$, $S_{DRV2}$, $S_{DRV3}$, $S_{DRV4}$ to the first, second, third and fourth power switches $Q_1$, $Q_2$, $Q_3$, $Q_4$. Of course, any driver capable of providing the gate-drive signals $S_{DRV1}$, $S_{DRV2}$, $S_{DRV3}$, $S_{DRV4}$ to control power switches is well within the broad scope of the present invention. As an example, a driver is disclosed in U.S. Pat. No. 7,330,017, entitled "Driver for a Power Converter and a Method of Driving a Switch Thereof," issued Feb. 12, 2008, and a power switch is disclosed in U.S. Pat. No. 7,230,302, entitled "Laterally Diffused Metal Oxide Semiconductor Device and Method of Forming the Same," issued Jun. 12, 2007 and in U.S. Pat. No. 7,214,985, entitled "Integrated Circuit Incorporating Higher Voltage Devices and Low Voltage Devices Therein," issued May 8, 2007, which are incorporated herein by reference.

It is recognized that a switched-capacitor dc-dc power converter does not precisely multiple an input voltage by a factor (e.g., an integer or a fraction) due to output ripple voltage and inherent losses in such circuits, which can reduce the average output voltage of the power converter. In general, the output voltage of a switched-capacitor dc-dc power converter decreases somewhat as the load on the power converter increases. The reduction in average output voltage due to output voltage ripple can be reduced by increasing the switching frequency of the power converter. Accordingly, the controller 210 of the power converter is coupled to an output characteristic (e.g., the output voltage VTT) of the power converter. The controller 210 of the power converter is also coupled to the input voltage VDDQ. The output voltage VTT and the input voltage VDDQ may be employed by the controller 210 to control the switching frequency $f_s$ of the power converter.

An approach to improve power conversion efficiency at low output currents, as described by X. Zhou, et al., in the paper entitled "Improved Light-Load Efficiency for Synchronous Rectifier Voltage Regulation Module," IEEE Transactions on Power Electronics, Volume 15, Number 5, September 2000, pp. 826-834, which is incorporated herein by reference, utilizes duty cycle adjustments to adjust switching frequency or to disable a synchronous rectifier switch. A further approach, as described by M. E. Wilcox, et al. ("Wilcox"), in U.S. Pat. No. 6,580,258, entitled "Control Circuit and Method for Maintaining High Efficiency Over Broad Current Ranges in a Switching Regulator Circuit," issued Jun. 17, 2003, which is incorporated herein by reference, generates a control signal to intermittently turn off one or more active power switches under light-load operating conditions when the output voltage of the power converter can be maintained at a regulated voltage by the charge on an output capacitor. Of course, when an output voltage from a power converter is temporarily discontinued, such as when the load coupled thereto is not performing an active function, the power converter can be disabled by an enable/disable signal, generated either at a system or manual level, which is a process commonly used, even in quite early power converter designs.

An example of portions of a controller employable in the controllers 210, 410 of FIGS. 2 and 4 is described by Demski, et al. A voltage-divider network (akin to multiplying by a fraction) is formed with resistors and a controller responsive to a ratio of an output voltage $V_{out}$ (akin to the second power bus voltage or second voltage VTT) to an input voltage $V_{in}$ (akin to the primary power bus voltage or first voltage VDDQ). The controller alters a switching frequency of the power converter in discrete steps to control an output voltage of the power converter. The replacement of a resistor-divider or dissipative regulator for the second power bus voltage VTT with a switched-capacitor dc-dc power converter is, in its purest form, lossless, while resistive or dissipative power conversion introduces a high level of power loss. Other power conversion methods are also dissipative to varying degrees. With proper design of capacitive circuit elements and choice of a switching frequency, a switched-capacitor dc-dc power converter for the second power bus voltage VTT is advantageously capable of reaching efficiency levels of 97% or greater, approaching the theoretical 100%, which cannot be achieved by conventional methods.

When the power levels and current draw of the DRAM modules (also referred to as DRAM(s), DRAM chip(s)) in a DIMM drop to very light levels below 20% of their full rated power, a light-load mode ("LLM") of control (or operation) is implemented by sensing a current demand associated with the second power bus voltage VTT of the DRAM module and then switching the switched-capacitor dc-dc power converter to a lower operating frequency at these lighter loads. This reduces power losses and raises power conversion efficiency in the light-load mode of operation. In an alternative embodiment, the second power bus voltage VTT is sensed and the operating frequency is reduced to a level sufficient to maintain a desired level of the second power bus voltage VTT.

Regarding the power converter of FIG. 4, a switched-capacitor power converter (e.g., a switched-capacitor dc-dc power converter) produces a second power bus voltage (again also referred to as an output voltage with respect to the power converter or a second voltage) VTT that is a multiple, two, of the primary power bus voltage (also referred to as an input voltage with respect to the power converter or a first voltage) VDDQ. The power converter of FIG. 4 employs first and second diodes $D_1$, $D_2$ in a switched-current path to provide the output voltage $V_{out}$ that is an approximate multiple of the input voltage $V_{in}$. A more precise integer multiple can be obtained by employing active power switches such as MOSFETs in place of the first and second diodes $D_1$, $D_2$. The switching action of the power converter illustrated in FIG. 4 is similar to that of the power converter of FIG. 2, and will not be described in more detail herein in the interest of brevity. Other power converter topologies may be constructed similar to that illustrated in FIG. 4 to provide a higher multiple, such as three, four, or more, of its input voltage VDDQ.

Since the switched-capacitor dc-dc power converters illustrated in FIGS. 2 to 4 are operated as unregulated open-loop power converters, voltage droop at a load coupled thereto is directly proportional to resistance of leads from the power converter to the load and to the output current. In a DIMM application, the use of a switched-capacitor dc-dc power converter that does not regulate its output voltage by varying a duty cycle of the active switches therein can be particularly advantageous if the power converter is placed on the DIMM card so that the voltage drop from the power converter to the DRAM module is less than, for example, 1% of the desired output voltage. Otherwise, a bit error rate increase and reduced DRAM speeds may occur. It is practically unworkable to achieve tight voltage accuracy of the unregulated second power bus voltage VTT if the power converter is placed off the DIMM card on the main motherboard since connector resistance between the DIMM card and the motherboard causes the voltage drop to exceed a tight tolerance.

Figure 5:
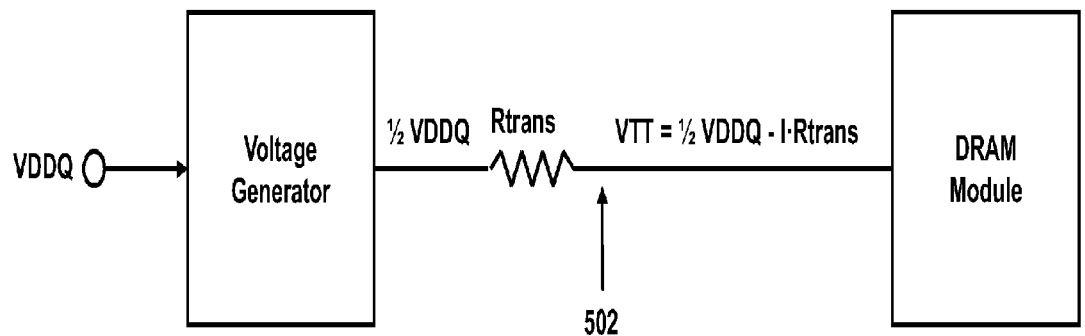
FIG. 5 illustrates a block diagram of an embodiment of a power converter coupled to a DRAM module in accordance with the principles of the present invention.

Turning now to FIG. 5, illustrated is a block diagram of an embodiment of a power converter (e.g., a switched-capacitor dc-dc power converter and also referred to as a voltage generator) coupled to a DRAM module in accordance with the principles of the present invention. FIG. 5 shows the effect of resistance of a circuit path 502 that couples the output of the voltage generator to the input of a DRAM module. The resistance of the circuit path 502 produces a voltage drop proportional to the product of a current flowing in circuit path 502 and the resistance Rtrans of circuit path 502. The resistance Rtrans of circuit path 502 is unacceptably large when the voltage generator and the DRAM module are coupled by the combination of a connector and trace resistance. The resistance Rtrans of the circuit path 502 can be reduced to a practical level that avoids the need to regulate the output of the voltage generator if both the voltage generator and the DRAM module are proximate one another such as being co-located on the same DIMM.

To produce a DIMM that avoids the need to regulate the output of the voltage generator, copper pillars or bumps on a silicon die (embodying the voltage generator) are employed to mount the voltage generator to a leadframe such as the upper wiring layer of a printed circuit board. Wire-bond resistance is generally too high to meet voltage dropout specifications for a voltage generator that operates on an open-loop, unregulated basis. The voltage generator is centrally located in the DIMM (or DIMM card) to feed both right-hand and left-hand DRAM modules with substantially equal voltage drops to preserve equal memory read/write speeds. Such a physical arrangement eases resistance drop requirement to one-half the length of a DIMM. In an advantageous embodiment, path resistances between the voltage generator and the DRAM modules are proportioned and balanced (e.g., equal) according to respective current loads therein to produce substantially equal voltages at terminals of the DRAM modules.

Figure 6:
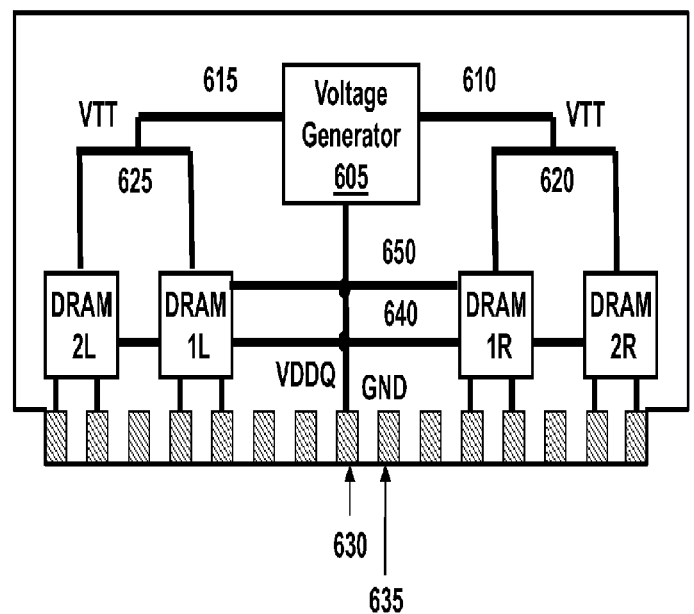
FIG. 6 illustrates a side view of an embodiment of a DIMM constructed according to the principles of the present invention.

Turning now to FIG. 6, illustrated is a side view of an embodiment of a DIMM constructed according to the principles of the present invention. The DIMM includes a power converter (e.g., a switched-capacitor dc-dc power converter and also referred to as a voltage generator) 605 that supplies a second power bus voltage VTT on circuit board traces 610, 615 (of a circuit board) to DRAM modules on the right side designated DRAM 2R, DRAM 1R and on the left side designated DRAM 2L, DRAM 1L. To preserve symmetrical speeds of each DRAM module, voltage drops between the voltage generator 605 and the DRAM modules should be substantially equal. Accordingly, the voltage generator 605 may be centrally located on the DIMM (or on the circuit board thereof), thereby reducing the resistance path via the circuit board traces 610, 615 to the DRAM modules to about one-half a length of the DIMM. In other words, the path resistances associated with the circuit board traces 610, 615 to ones of the DRAM modules is substantially balanced or equal. By forming circuit board traces with sufficient cross-sectional area and with resistances proportionately balanced, the voltage drop at nodes 620, 625 to the DRAM modules can be sufficiently small and balanced to avoid the need to separately regulate the second power bus voltage (also an output voltage with respect to the voltage generator 605 or a second voltage) VTT of the voltage generator 605.

The voltage generator 605 receives a primary power bus voltage (also an input voltage with respect to the voltage generator 605 or a first voltage) VDDQ from edge-connector contacts located near the voltage generator 605 such as an edge-connector contact 630 for the primary power bus voltage VDDQ and as edge-connector contact 635 for ground GND. The primary power bus voltage VDDQ to the voltage generator 605 is also coupled over traces 640, 650 with sufficient cross-sectional area that are proportioned and balanced (via resistances thereof) to the DRAM modules. The DRAM modules are typically supplied with substantially equal voltages. Thus, the DRAM modules are advantageously accurately powered from the primary power bus voltage VDDQ and the second power bus voltage VTT (about one-half of the primary power bus voltage VDDQ) from the voltage generator 605. The physical arrangement of the DIMM in conjunction with the architecture of the voltage generator 605 avoids the need for a long conductive powering path passing through the resistance of the edge connector that connects the DIMM to a conventional motherboard. In an alternative embodiment, the voltage generator 605 may produce a second power bus voltage VTT that is a multiple, such as two, of the primary power bus voltage VDDQ. For simplicity, the distribution of circuit ground voltage ("GND") is not illustrated herein.

Figure 7A:
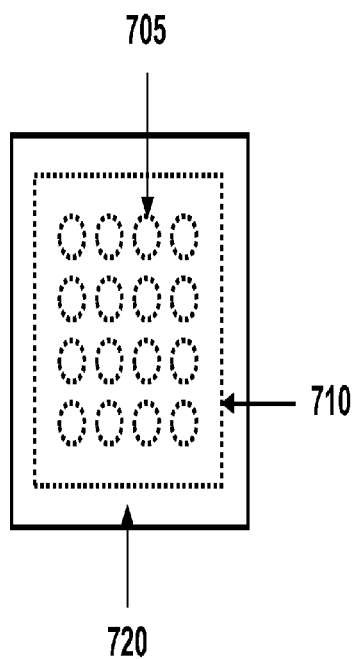
FIGS. 7A and 7B illustrate bottom and side views, respectively, of an embodiment of a power converter constructed according to the principles of the present invention.
Figure 7B:
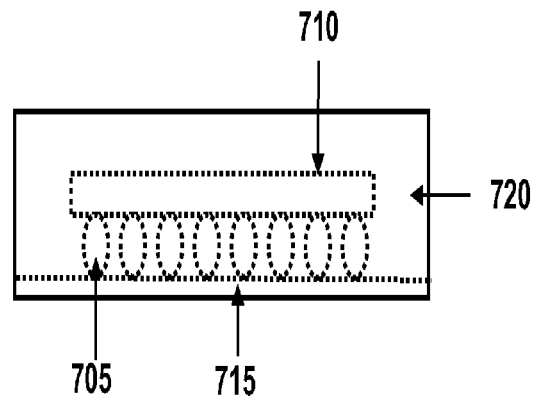

Turning now to FIGS. 7A and 7B, illustrated are bottom and side views, respectively, of an embodiment of a power converter (e.g., a switched-capacitor dc-dc power converter and also referred to as a voltage generator) constructed according to the principles of the present invention. A plurality of bumps (e.g., copper solder bumps) 705 are located on the bottom of the voltage generator (formed as an integrated circuit in a chip such as a silicon die) 710 to couple the same to a leadframe 715. The leadframe 715 can be upper traces of a printed circuit board or a separate leadframe employed for the voltage generator 710. The voltage generator 710 is preferably encapsulated in a molded plastic package 720.

Figure 8:
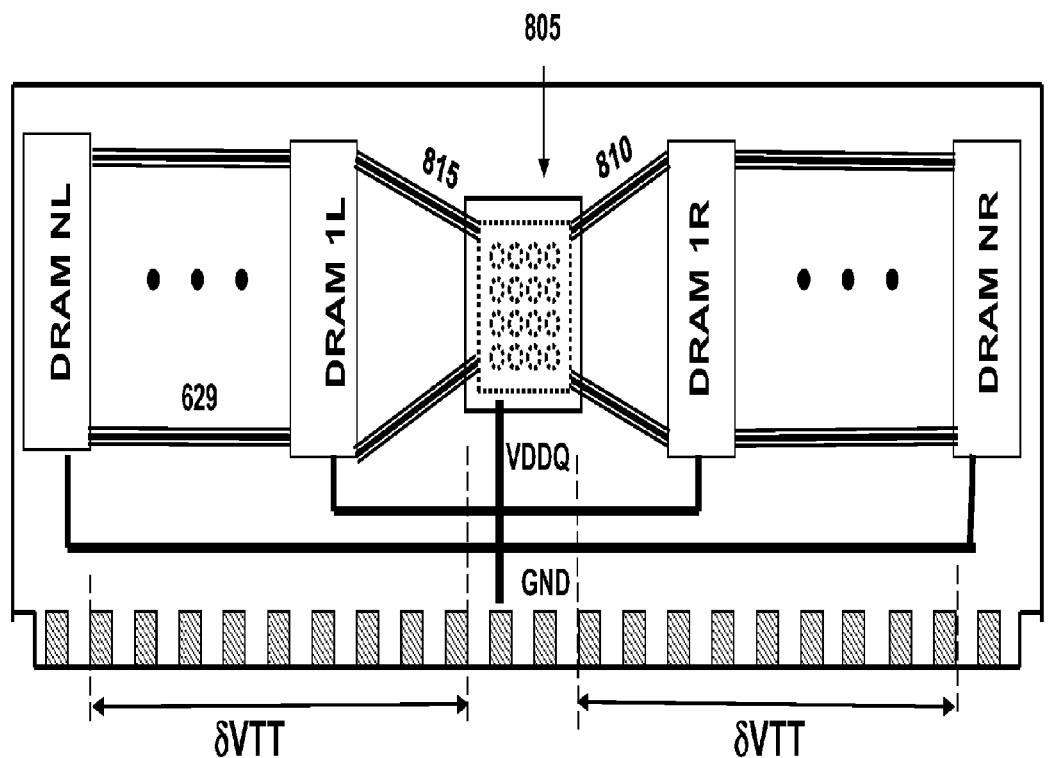
FIG. 8 illustrates a plan-view drawing of a DIMM circuit board showing placement and interconnection of a bias voltage generator with a plurality of memory modules, constructed according to the principles of the present invention.

Turning now to FIG. 8, illustrated is a side view of an embodiment of a DIMM constructed according to the principles of the present invention. The DIMM includes a power converter (e.g., a switched-capacitor dc-dc power converter and also referred to as a voltage generator) 805 that supplies a second power bus voltage VTT on circuit board traces 810, 815 (of a circuit board) to DRAM modules on the right side designated DRAM 2R, DRAM 1R and on the left side designated DRAM 2L, DRAM 1L. To preserve symmetrical speeds of each DRAM module, voltage drops δVTT between the voltage generator 805 and the DRAM modules should be substantially equal. In other words, the path resistances associated with the circuit board traces 810, 815 to ones of the DRAM modules is substantially balanced or equal. Accordingly, the voltage generator 805 may be centrally located on the DIMM (or on the circuit board thereof).

Figure 9:
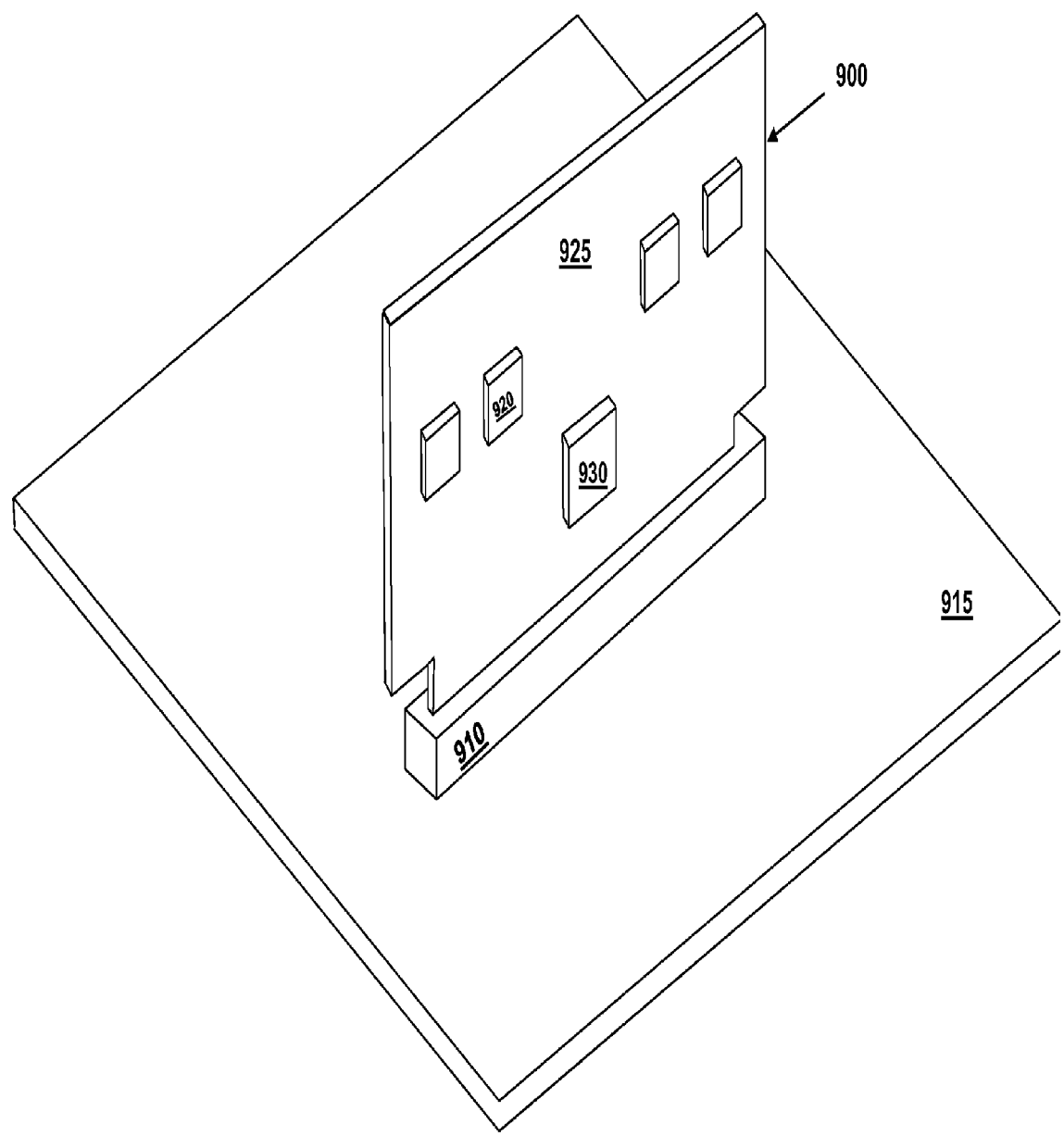
FIG. 9 illustrates an isometric view of an embodiment of a DIMM coupled to a connector located on motherboard of an electronic system in accordance with the principles of the present invention.

Turning now to FIG. 9, illustrated is an isometric view of an embodiment of a DIMM 900 coupled to a connector 910 located on motherboard 915 of an electronic system in accordance with the principles of the present invention. The connector 910 is generally a dual-in-line connector, but a single-in-line connector can also be used in other applications. The DIMM 900 includes four DRAM modules (one of which is designated 920) coupled to a circuit board 925 thereof, but more or less DRAM modules may be employed in a particular application. The DRAM modules 920 are provided first and second voltages via a power converter (e.g., a switched-capacitor dc-dc power converter and also referred to as a voltage generator) 930 co-located on the circuit board 925 of the DIMM 900 with the DRAM modules 920.

Those skilled in the art should understand that the previously described embodiments of a power converter and related methods of constructing the same are submitted for illustrative purposes only. In addition, other embodiments capable of producing a power converter employable with other switch-mode power converter topologies are well within the broad scope of the present invention. While the power converter has been described in the environment of a power converter including a controller to control an output characteristic to power a load, the power converter including a controller may also be applied to other systems such as a power amplifier, a motor controller, and a system to control an actuator in accordance with a stepper motor or other electromechanical device.

For a better understanding of power converters, see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). The aforementioned references are incorporated herein by reference in their entirety.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus, comprising:
   first and second memory modules, located on a circuit board, configured to operate from a first voltage and a second voltage always being an integer multiple of said first voltage; and
   a power converter employing a switch-mode power train, located on said circuit board, comprising a plurality of switches configured to provide said second voltage to said first and second memory modules from said first voltage by controlling a plurality of switching frequencies of the plurality of switches, wherein at least one of the plurality of switches is coupled to a capacitor configured to store said second voltage, and wherein path resistances associated with circuit board traces on said circuit board from said power converter to said first and second memory modules are substantially balanced.

2. The apparatus as recited in claim 1 wherein said first voltage represents an input voltage to said power converter and said second voltage represents an output voltage of said power converter.

3. The apparatus as recited in claim 1 wherein a voltage drop between said power converter and said first and second memory modules is substantially equal.

4. The apparatus as recited in claim 1 wherein said power converter is substantially centrally located on said circuit board.

5. The apparatus as recited in claim 1 wherein said power converter is operable in a light-load mode of operation with a switching frequency dependent on a current drain of said first and second memory modules at said second voltage.

6. The apparatus as recited in claim 1 wherein the plurality of power switches of said switch-mode power train are alternately enabled to conduct to provide said second voltage as an output voltage of said power converter.

7. The apparatus as recited in claim 1 wherein said power converter is embodied in a silicon die coupled to a leadframe through solder bumps.

8. The apparatus as recited in claim 7 wherein said solder bumps are copper.

9. The apparatus as recited in claim 1 wherein said integer multiple is always one-half.

10. The apparatus as recited in claim 1 wherein said first and second memory modules are digital random-access memory modules.

11. A method, comprising:
    providing a first voltage to first and second memory modules located on a circuit board; and
    providing a second voltage always being a one-half integer multiple of said first voltage to said first and second memory modules with a power converter employing a switch-mode power train located on said circuit board, wherein path resistances associated with circuit board traces on said circuit board from said power converter to said first and second memory modules are substantially balanced.

12. The method as recited in claim 11 wherein said first voltage represents an input voltage to said power converter and said second voltage represents an output voltage of said power converter.

13. The method as recited in claim 11 wherein a voltage drop between said power converter and said first and second memory modules is substantially equal.

14. The method as recited in claim 11 wherein said power converter is substantially centrally located on said circuit board.

15. The method as recited in claim 11 further comprising operating said power converter in a light-load mode of operation with a switching frequency dependent on a current drain of said first and second memory modules at said second voltage.

16. The method as recited in claim 11 further comprising alternately enabling conduction of power switches of said switch-mode power train to provide said second voltage as an output voltage of said power converter.

17. The method as recited in claim 11 wherein said power converter is embodied in a silicon die coupled to a leadframe through solder bumps.

18. The method as recited in claim 17 wherein said solder bumps are copper.

19. The method as recited in claim 11 wherein said first and second memory modules are digital random-access memory modules.

* * * * *